United States Patent [19]
Alvis et al.

[11] Patent Number: 5,710,052
[45] Date of Patent: Jan. 20, 1998

[54] SCANNING SPREADING RESISTANCE PROBE

[75] Inventors: Roger L. Alvis, Cupertino; Andrew N. Erickson, Santa Barbara, both of Calif.

[73] Assignee: Advanced Micro Devices, Inc., Sunnyvale, Calif.

[21] Appl. No.: 543,979

[22] Filed: Oct. 17, 1995

[51] Int. Cl.⁶ .................... H01L 21/66; G01R 31/26; G01N 23/00
[52] U.S. Cl. .................... 437/8; 324/765; 250/306
[58] Field of Search .................... 437/8; 324/765; 250/306

[56] References Cited

U.S. PATENT DOCUMENTS

| | | | |
|---|---|---|---|
| 5,185,273 | 2/1993 | Jasper | 437/8 |
| 5,217,907 | 6/1993 | Buluccea et al. | 437/8 |
| 5,520,769 | 5/1996 | Barrett et al. | 437/8 |
| 5,523,700 | 6/1996 | Williams et al. | 324/765 |

*Primary Examiner*—Brian Dutton
*Attorney, Agent, or Firm*—H. Donald Nelson

[57] ABSTRACT

An accurate method of measuring the two-dimensional doping profile of a semiconductor by measuring an electrical parameter along a path of a dopant iso-concentration. Thin vertical or horizontal slices of the semiconductor integrated circuit are provided and are probed to allow the electrical parameter to be measured through a single concentration area.

7 Claims, 8 Drawing Sheets

SCANNING SPREADING RESISTANCE PROBE

BACKGROUND OF THE INVENTION

1. Field of the Invention

This invention relates generally to semiconductor wafer manufacturing, and, more particularly, to a method of measuring manufacturing parameters for quality and performance improvement.

2. Discussion of the Related Art

The rapid growth of technological requirements and the worldwide acceptance of sophisticated electronic devices have created an unprecedented demand for large-scale, complex, integrated circuits. Meeting these demands has required technological advances in materials and processing equipment and significant increases in the number of individuals involved in integrated circuit design. In addition there has been an increased emphasis on effectively utilizing sophisticated test instruments to aid in the analysis of the manufacturing parameters so that the design and manufacturing process can be improved in order to increase the performance of the final semiconductor product.

In order for the circuit designer to have the flexibility needed to optimize integrated circuit design it is necessary for the circuit designer to have available precise measurements regarding processing and fabrication technology and how changes in processing and fabrication technology impact the final geometrical dimensions and electrical parameters of the final product and therefore the performance of the final product. With this knowledge the circuit designer can consider the actual layout during design and the appropriate parameters can be included in the analysis. Innovative techniques that improve performance often involve circuits or geometries that are dependent on and applicable to a particular process. Knowledge of processing characteristics enables the designer to make yield calculations during design and consider tradeoffs between yield, performance and design simplicity. In order for the circuit designer to make valid tradeoffs between geometries and performance or to increase performance by changing geometries the circuit designer must have precise measurements of the geometries as well as the semiconductor parameters such as doping concentrations.

The major steps involved in producing integrated circuits (ICs) must be considered from a qualitative viewpoint to understand and appreciate the criticality of obtaining precise measurements for the circuit designer and to understand and appreciate the extremely small dimensions involved in semiconductor processing.

The basic element of an integrated circuit is a transistor. Many steps are involved in the production of a functional transistor. The first step involves obtaining a single crystal substrate, for example, a lightly doped p-type or n-type silicon wafer. On this wafer, a thin layer of silicon dioxide, on the order of 35–500 Å is grown across the entire wafer by means of thermal oxidation. Next, a gate electrode material is deposited, for example, a doped polysilicon layer between 1000 and 5000 Å in thickness. From this stack, gates are formed by lithographically patterning areas to be protected, removing all of the unprotected polysilicon and silicon dioxide, and exposing the silicon substrate in those areas. At this point, the source and drain regions are created by introducing impurities into the silicon substrate through means of ion implantation and electrically activated by a subsequent high temperature anneal. The final positions of these dopant atoms are affected by the time and temperature of this anneal, and are carefully chosen to affect the desired dopant distribution in three-dimensions that are so critical to the electrical behavior of a transistor; and, as production device dimensions shrink to 0.25 μm, the placement of the actual dopants to within 10–20 atomic positions becomes key to the speed and reliability of a transistor.

In order to determine exactly how annealing conditions re-position dopant atoms, hence the effect of processing on transistor performance, the device engineer must first be able to quantitatively determine the position the various doping concentration contours. For characterization of contours in one dimension, there exists a number of methods, the most common of which are secondary ion mass spectroscopy (SIMS) and spreading resistance probing (SRP). Both of these 1-D (one dimensional) methods measure doping contours from the surface, down through the bulk of the substrate. The major limiting factor in either of these methods from exploring a two-dimensional (2-D) dopant distribution is the fact that the SIMS ion probe and the two SRP metal probes are much larger than the dimensions to be measured.

Other methods such as transmission electron microscopy (TEM) and atomic force microscopy (AFM) may qualitatively reveal the 2-D nature of doping in a transistor, but suffer from the inability to provide quantitative measurements without calibration from 1-D methods such as SIMS or SRP. Other techniques based on scanned probes such as scanning capacitance microscopy (SCM) are showing promise as potential stand-alone quantitative 2-D dopant profiling tools. However, a universal relationship between doping level and capacitance, analogous to the resistance-doping relationship exploited by SRP, has yet to be established for SCM. Nevertheless, once a reliable 2-D doping tool is established, it is a conceptually simple matter of combining serial two-dimensional doping distributions to construct a three-dimensional picture of the doping distribution in a transistor. Thus, what is needed is a single-tool method to two-dimensionally quantify the position and concentration of dopant atoms in semiconductor devices such as the transistor discussed above.

Figure 4:
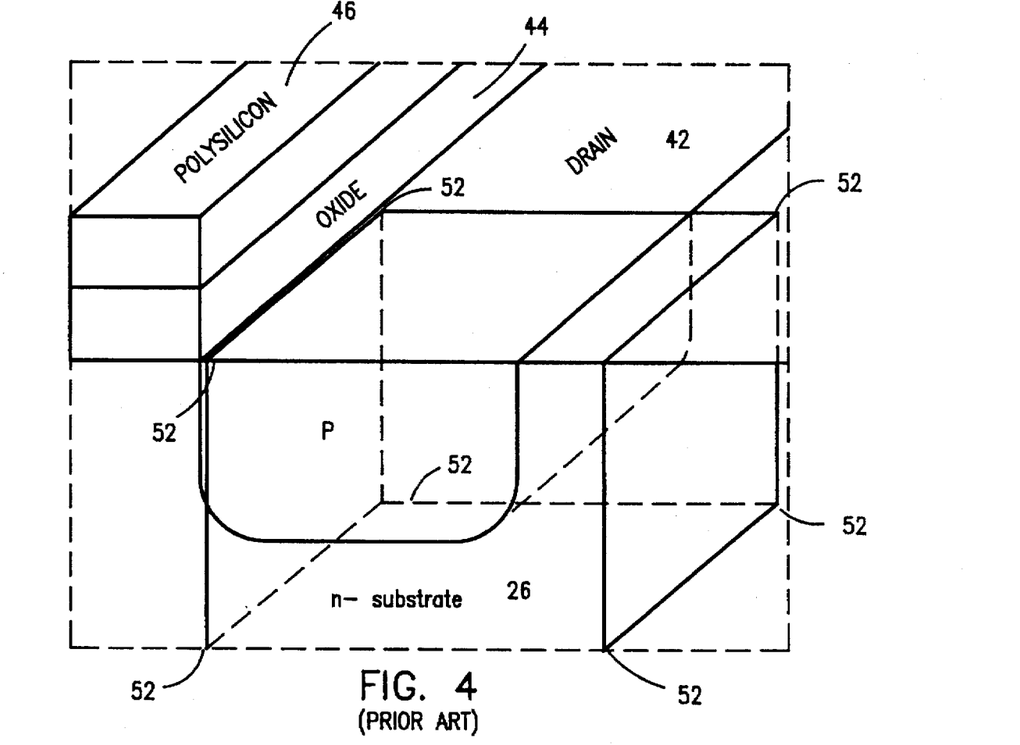
FIG. 4 shows a prior art method of obtaining a two-dimensional doping profile.
Figure 5:
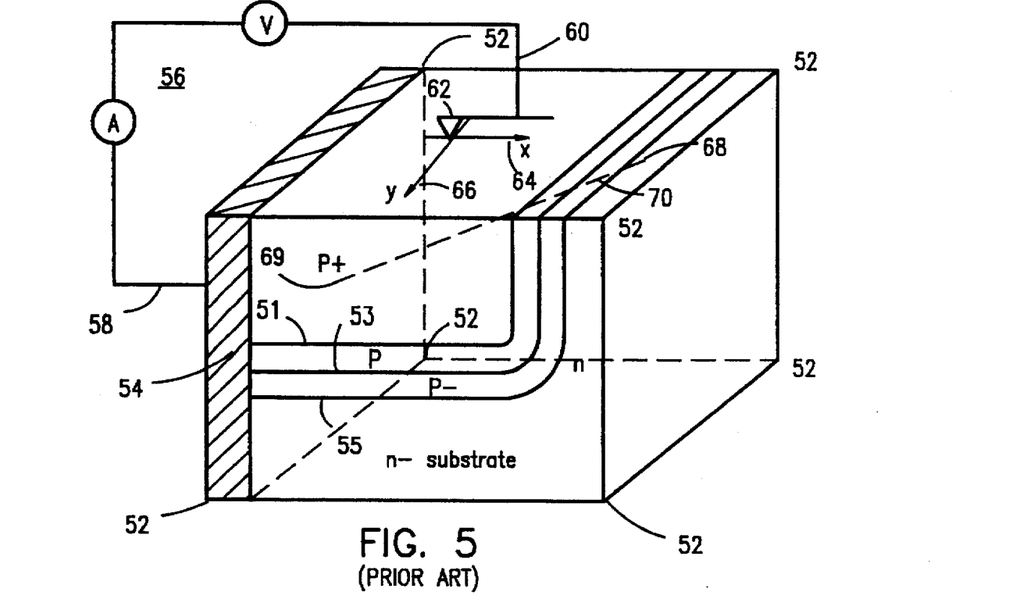
FIG. 5 shows a detailed view of the prior art method shown in FIG. 4.
Figure 5A:
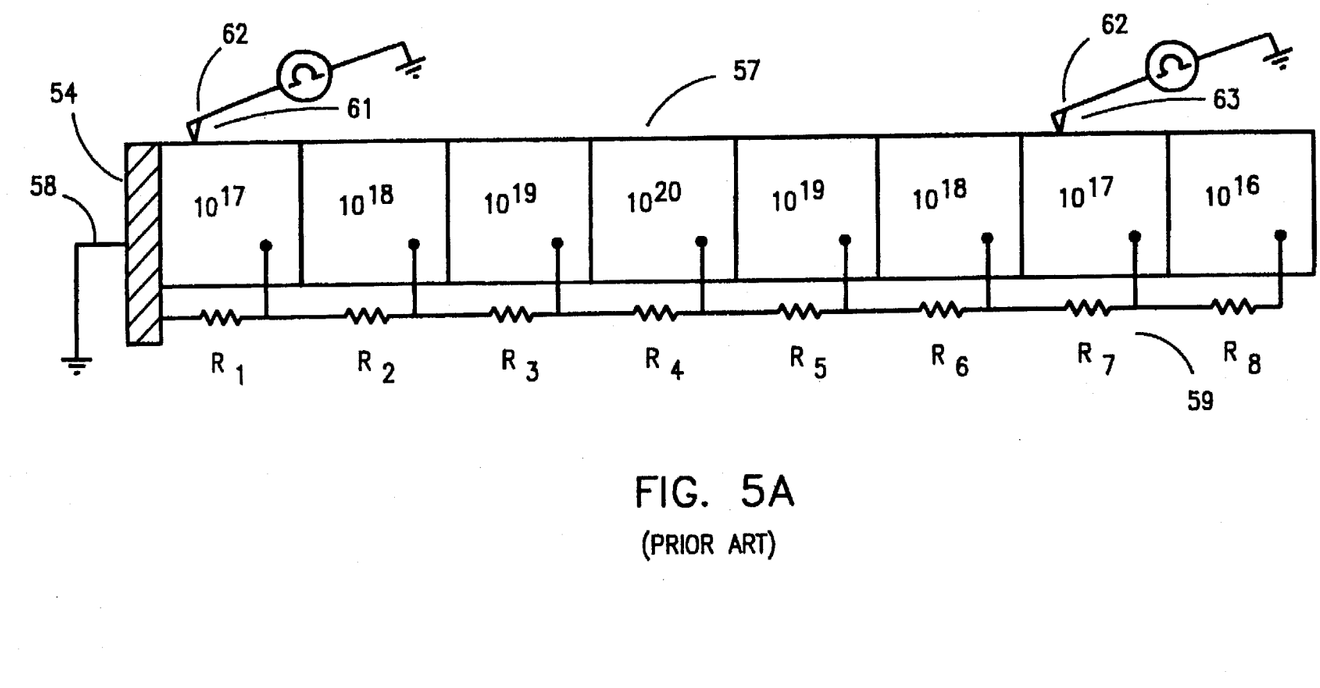
FIG. 5A shows a schematic representation of a prior art retrograded doping profile and the equivalent series resistance representation of the device shown in FIG. 5.

Prior art methods, shown in FIGS. 4, 5, and 5A provide 2-D information that is, at best, convoluted by measuring resistance through multiple layers of varying dopant concentrations. The two-dimensional information from the prior art is limited to the x-y plane as defined by the top surface of the wafer and does not reveal any z-direction information, as defined by the perpendicular direction into the wafer. FIG. 5A illustrates the difficulty of obtaining accurate measurements from even a one-dimensional dopant distributions, where the retrograde doping scheme shown in FIG. 5A would cause measurements from two separate locations of the same concentration (i.e., $10^{17}$ atoms/cc) would yield vastly different results.

Accordingly, the device and circuit designer require non-convoluted, easily interpretable information from any x-y, x-z, or y-z plane in order to determine precisely the two-dimensional distribution and thus be able to construct the three-dimensional dopant distribution in an actual transistor.

SUMMARY OF THE INVENTION

An accurate method of measuring the two-dimensional doping profile of a portion of a semiconductor by measuring an electrical parameter along a path of a dopant iso-concentration.

In one embodiment of the present invention a thin vertical slice or a thin horizontal slice of the semiconductor is taken from the area of the semiconductor to be measured and includes at least one boundary between an area of a first concentration and an area of second concentration. A conductive plate is bonded to one side of the slice and a probe scans the other side of the slice.

In another embodiment of the present invention a trench is milled behind the area of the semiconductor to be measured. The trench is filled with a conductive material and the surface of the semiconductor opposite to the trench is scanned by a probe. Each embodiment can include one or more areas with known doping concentrations so that the measurement can be calibrated to provide an absolute value of concentration.

The present invention is better understood upon consideration of the detailed description below, in conjunction with the accompanying drawings. As will become readily apparent to those skilled in this art from the following description there is shown and described preferred embodiments of this invention simply by way of illustration of the modes best suited to carry out the invention. As it will be realized, the invention is capable of other different embodiments, and its several details are capable of modifications in various, obvious aspects all without departing from the scope of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION OF THE PREFERRED EMBODIMENTS

Figure 1:
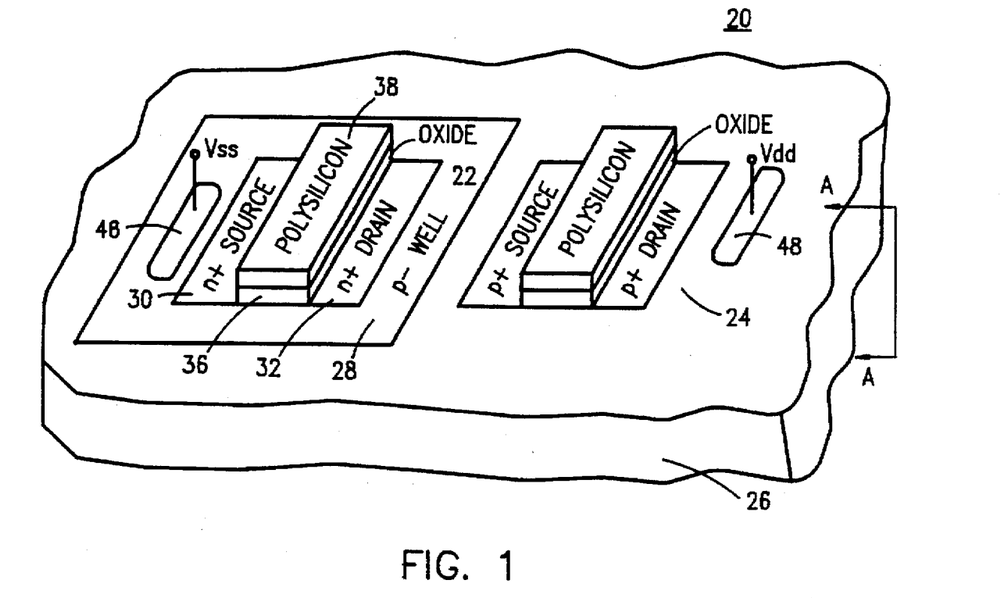
FIG. 1 shows a portion of a semiconductor structure showing an n-channel MOSFET structure and a p-channel MOSFET structure.
Figure 2:
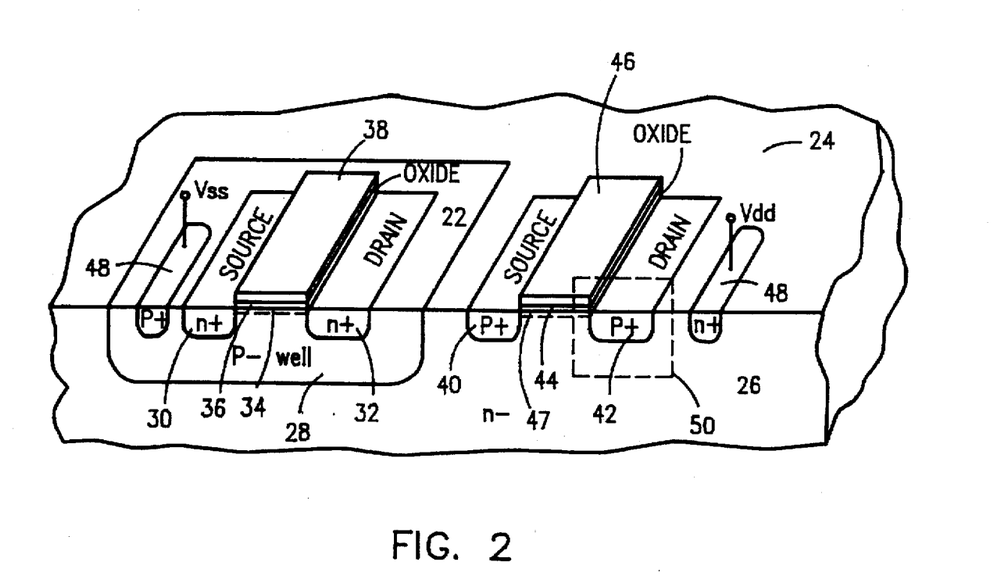
FIG. 2 shows a portion of the semiconductor structure shown in FIG. 1 with an area specified to be measured.
Figure 3:
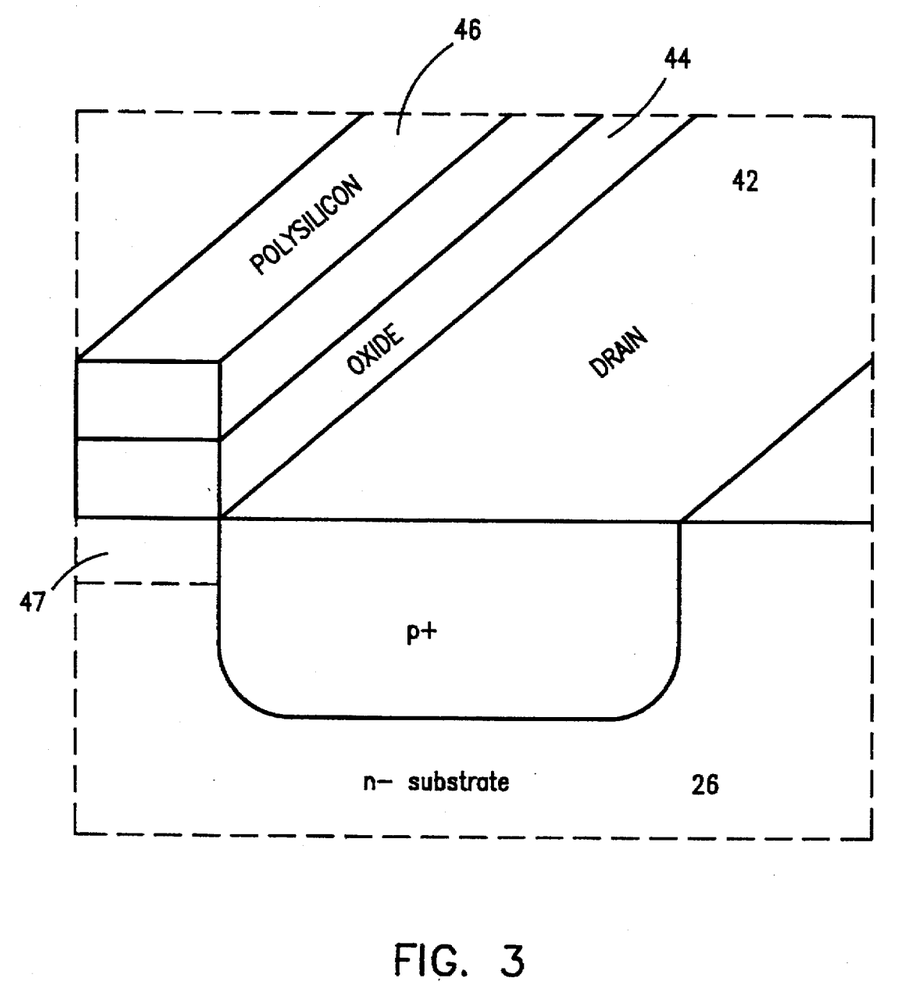
FIG. 3 is an enlarged view of a section of the semiconductor structure shown in FIG. 2.

Referring now to FIG. 1, there is shown a portion of an integrated device 20 with an n-channel MOSFET 22 and a p-channel MOSFET 24. The portion of the integrated device 20 is shown with a semiconductor substrate 26 which is shown as an n-type substrate. It should be apparent that devices with a p-type substrate can also be measured using this method. FIG. 2 shows a section obtained by cutting the portion of the integrated device 20 shown in FIG. 1 along section AA. FIG. 2 shows more clearly the structure of the n-channel MOSFET 22 and the p-channel MOSFET 24. Because the substrate in this particular example is an n-type material, the n-channel MOSFET 22 is placed in a p-well indicated at 28. FIG. 2 shows the n-channel 34 between source 30 and drain 32 and under gate oxide layer 36 which is under a gate 38 made up of polysilicon. Similarly, p-channel MOSFET 24 has a source 40, a drain 42, a gate oxide layer 44, and a gate 46 also made of polysilicon. The p-channel is shown at 47. In addition, there are two voltage sources 46 and 48 shown in FIGS. 1 and 2. It should be clear that the description of the two particular devices is illustrative only and other structures could be substituted without changing the scope of the description. Also shown in FIG. 2 is a section indicated by dashed lines at 50. This section is shown in FIG. 3 in an enlarged view. The remaining Figures and discussion will be related to this enlarged view.

Referring now to FIGS. 4 and 5 there is illustrated the prior art method of obtaining a two-dimensional dopant profile. The prior art method comprises taking a portion of a device and for illustrative purposes only, the portion shown within the box with corners indicated by 52. This portion shown in FIG. 5 is then prepared for probing by attaching a conductive plate 54 to one end of the sample. A probe circuit 56 has one lead 58 connected to conductive plate 54 and another lead 60 connected to probe 62 which is scanned in the x-y plane, indicated at 64 and 66. Also shown in FIG. 5 is a representation that the concentration in the drain 42 region varies and is indicated by a p+, p, and p-. Lines 51, 53, and 55 represent arbitrary doping contours and can be spoken of as boundaries separating areas with different dopant concentrations of the same type. As can be appreciated, when a measurement is taken when the probe is positioned as shown, the electrical path from the probe tip to the conductive plate starts in a p region and then goes through a p+ region before it reaches the conductive plate 54. As can be appreciated, there are points that will be probed such as point 68 wherein the electrical path starts in an n region, travels through a p– region, a p region, and finally a p+ region before it reaches conductive plate 54 at point 69. The path from point 68 to point 69 on conductive plate 54 is represented by dashed line 70. When the measurement includes more than one concentration it is a very convoluted current path that must accurately account for the different concentrations to determine an accurate value for the region of interest. For example, in FIG. 5A there is shown an the limitations of the prior art. A section 57 of an integrated circuit with varying doping contours is shown with the conductive plate 54 attached and a probe lead 58 connected between plate 54 and ground. An equivalent circuit 59 is shown and represented by resistances connected in series from one doping contour to the next. If probe 62 is placed at a first location 61 which is shown as a doping concentration of $10^{17}$ the path to ground is represented by resistance $R_1$. If probe 62 is placed at a second location 63 which is also shown as a doping concentration of $10^{17}$ the path to ground is the series resistance $R_1+R_2+\ldots+R_7$. Thus, as can be appreciated the measurement will not show that the doping concentrations from these two locations are the same.

Figure 6:
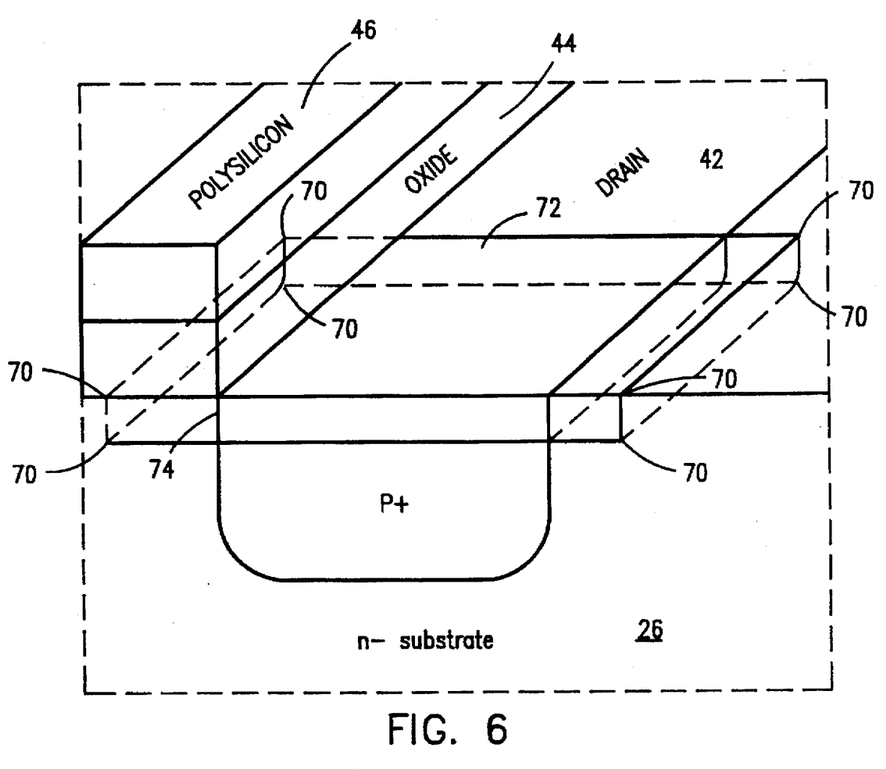
FIG. 6 shows an embodiment of the present invention showing a horizontal section used for measurement.
Figure 7:
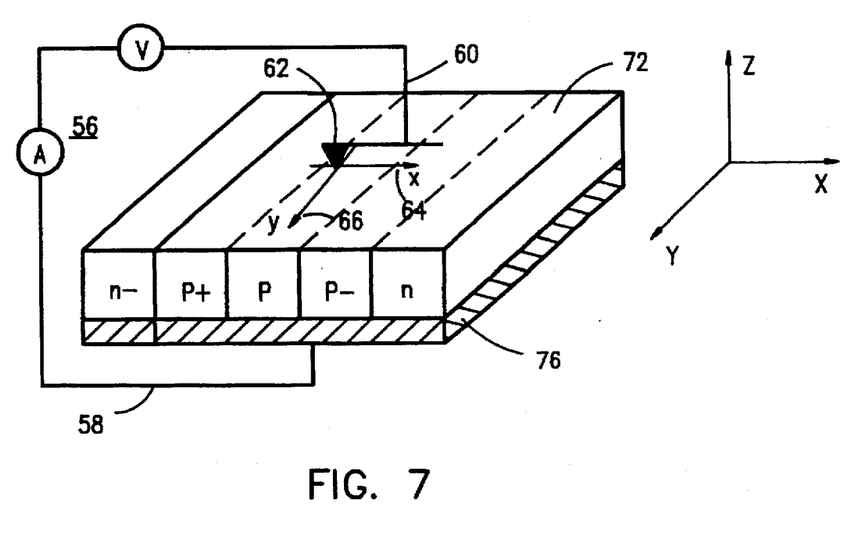
FIG. 7 shows a detailed view of the method shown in FIG. 6.

Referring now to FIGS. 6 and 7 there is shown a preferred embodiment of the present invention. In this embodiment, there is a thin horizontal slice 72, depicted by corners labeled 70. It should be noted that the thin horizontal slice 72 extends under gate oxide layer 44. For the measurement to be taken the gate oxide layer 44 and the gate 46 is stripped off so that a substantially flat surface can be probed which allows the concentration profile to be determined for boundary regions 74 for example. It is noted that in some instances a non-flat surface is preferable in that the topography may indicate the location of features that have been stripped. Referring now to FIG. 7 the horizontal section 72 has a conductive plate 76 connected to one side of horizontal section 72. The probe circuit 56 has one lead 58 connected to the conductive plate 76 and another lead 60 connected to probe 62. Horizontal section 72 provides iso-concentration regions in the z-direction for the electrical path from the probe 62 to the conductive plate 76. For example, when the probe 62 is located as shown in FIG. 7 the path from the probe 62 to conductive plate is substantially only through a p iso-concentration region. When the probe 62 is scanned in the x-y plane as indicated by 64 and 66 the current path at any x-y coordinate position is through a single concentration region.

Figure 8:
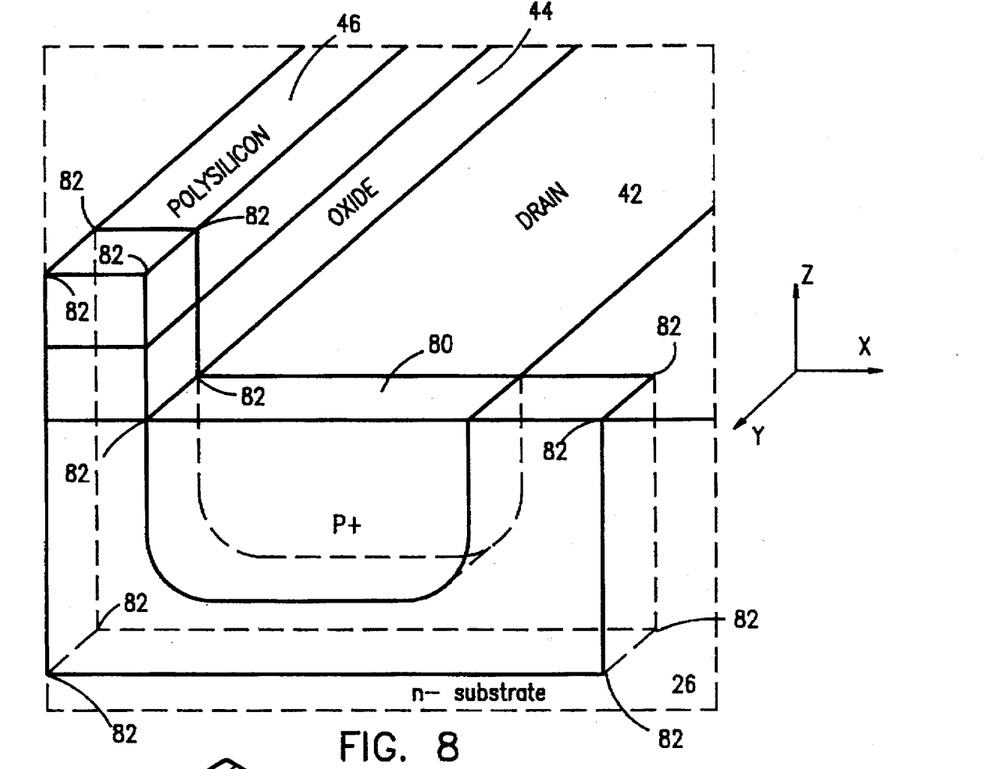
FIG. 8 shows an embodiment of the present invention showing a vertical section used for measurement.
Figure 9:
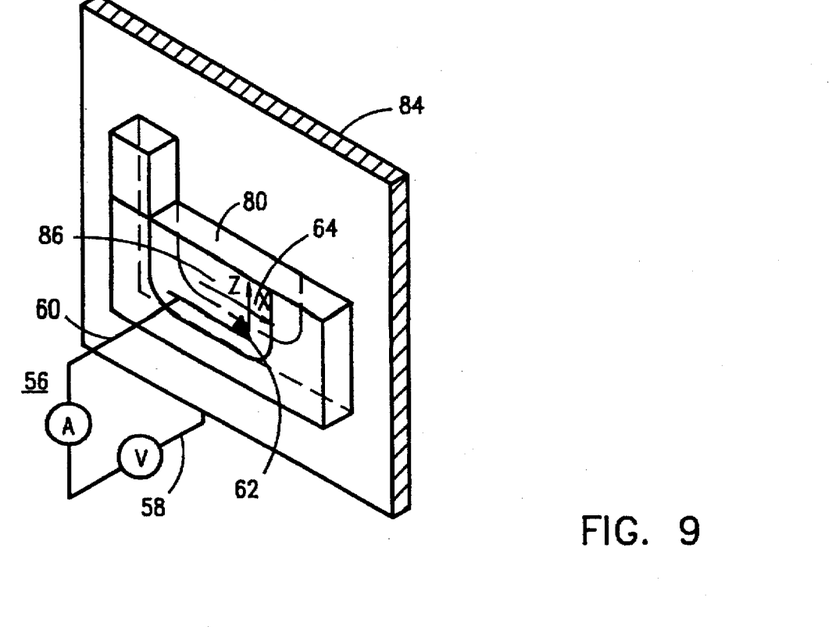
FIG. 9 shows a detailed view of the method shown in FIG. 8.
Figure 10:
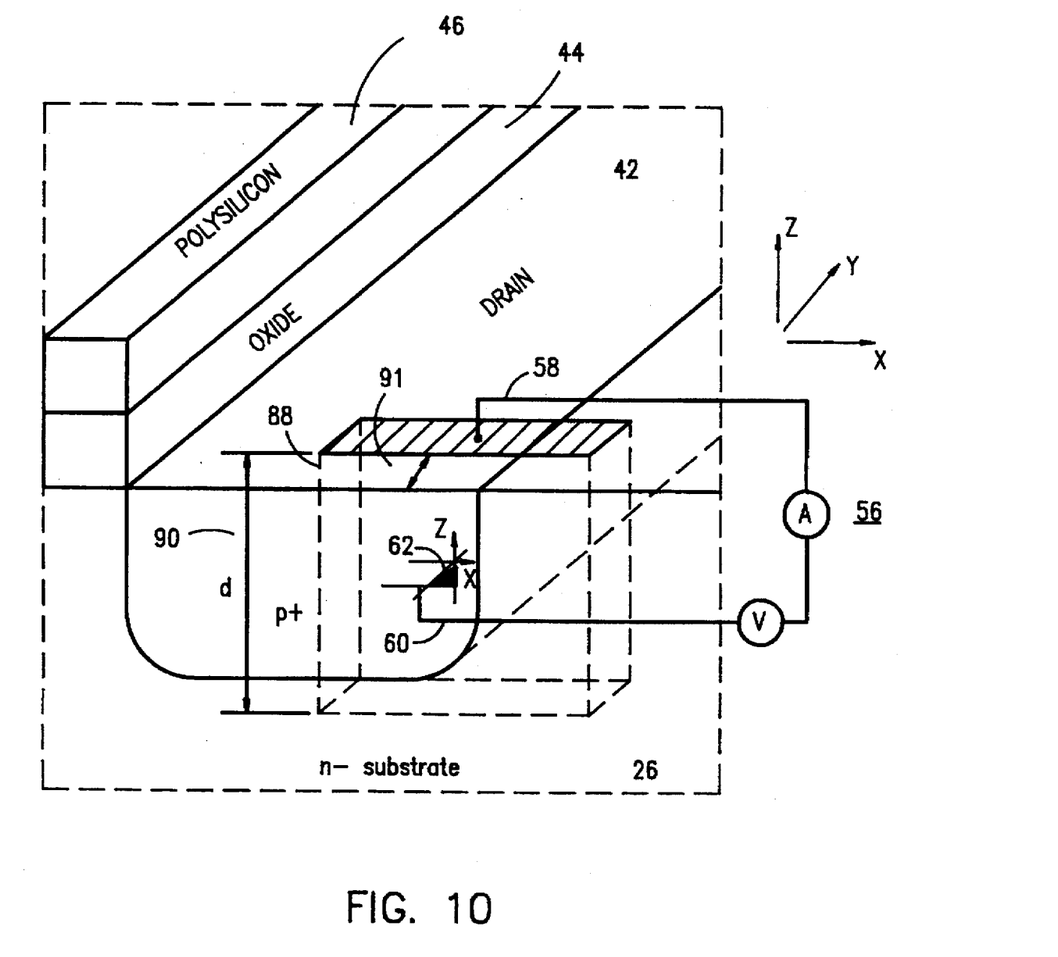
FIG. 10 shows an embodiment of the present invention with a trench provided behind an area to be measured.

Referring now to FIGS. 8 and 9 there is shown an alternative embodiment of the present invention. In this embodiment a vertical section 80 is to be measured and is depicted by the shape with 82 at each corner. A conductive plate 84 is attached to one side of section 80 and probe circuit 56 is connected with lead 58 connected to conductive plate 84 and with lead 60 connected to probe 62. Using the same coordinate system as before, the two-dimensional profile will be in the x-z plane as indicated at 64 and 86. The z direction is the direction into or out of the face of the wafer. As can be appreciated, the vertical section can be taken in a direction rotated 90° from the orientation shown in FIG. 9. In that case the two-dimensional profile would be in the y-z plane. It is also noted that in the case of the vertical sections the sections are taken such that there are no boundaries within the section parallel to the face of the section. This is so that the current path remains through a single concentration region. The advantage of having a current path through an iso-concentration region is that a simple resistor model may be used to model the current induced: $R=\rho L/A$ where R=resistance, $\rho$=resistivity, L=length, and A=Area. L and A are defined instrumentally leaving resistivity ($\rho$) of the material as the sample's only contribution to current modulation. As resistivity is proportional to the doping concentration level, the doping concentration level along the current path ultimately determines the measured current (resistance). Thus, it should be clear that doping schemes could be such that, for example in FIG. 5, considerably different current paths between conductive plate 54 and probe 62 could be measured, each resulting in a different measured current (resistivity) for the same doping concentration. For a device to be measured in cross-section, the essential requirement for iso-concentration current path approximation is a non-varying dopant profile in one direction, specifically in the linear direction between the probe and the backing conductive plate. If this is not the case, for example, if the probe and plate are not aligned or the backing plate does not intersect the entire doped region, the complications of the prior art, that is, convoluted current paths, as discussed above are encountered. FIG. 10 shows still another embodiment of the present invention. In this embodiment a trench 88 is cut in a region of a semiconductor that is to be measured. Trench 88 is located at a selected distance represented at 91 from the surface that is to be measured. The distance 91 can vary with the main criteria being that iso-concentration current paths are provided between the probe surface and the trench. Trench 88 is filled with a conductive material such as platinum. Trench 88 is cut so the depth d indicated at 90 is such that it extends to a dimension at least the same as the surface that is to be measured. Probe circuit 56 is connected with lead 58 connected to the material in the trench and lead 60 connected to probe 62. In the case shown in FIG. 10, probe 62 is scanned in the x-z direction. Also, as can be appreciated, to obtain the two-dimensional profile in the y-z direction, the vertical slice can be made in a direction rotated by 90° from that shown in FIG. 10 and the trench 88 would also be rotated by 90° from that shown in FIG. 10. In that case, the two-dimensional dopant concentration profile would be in the y-z direction.

Figure 11:
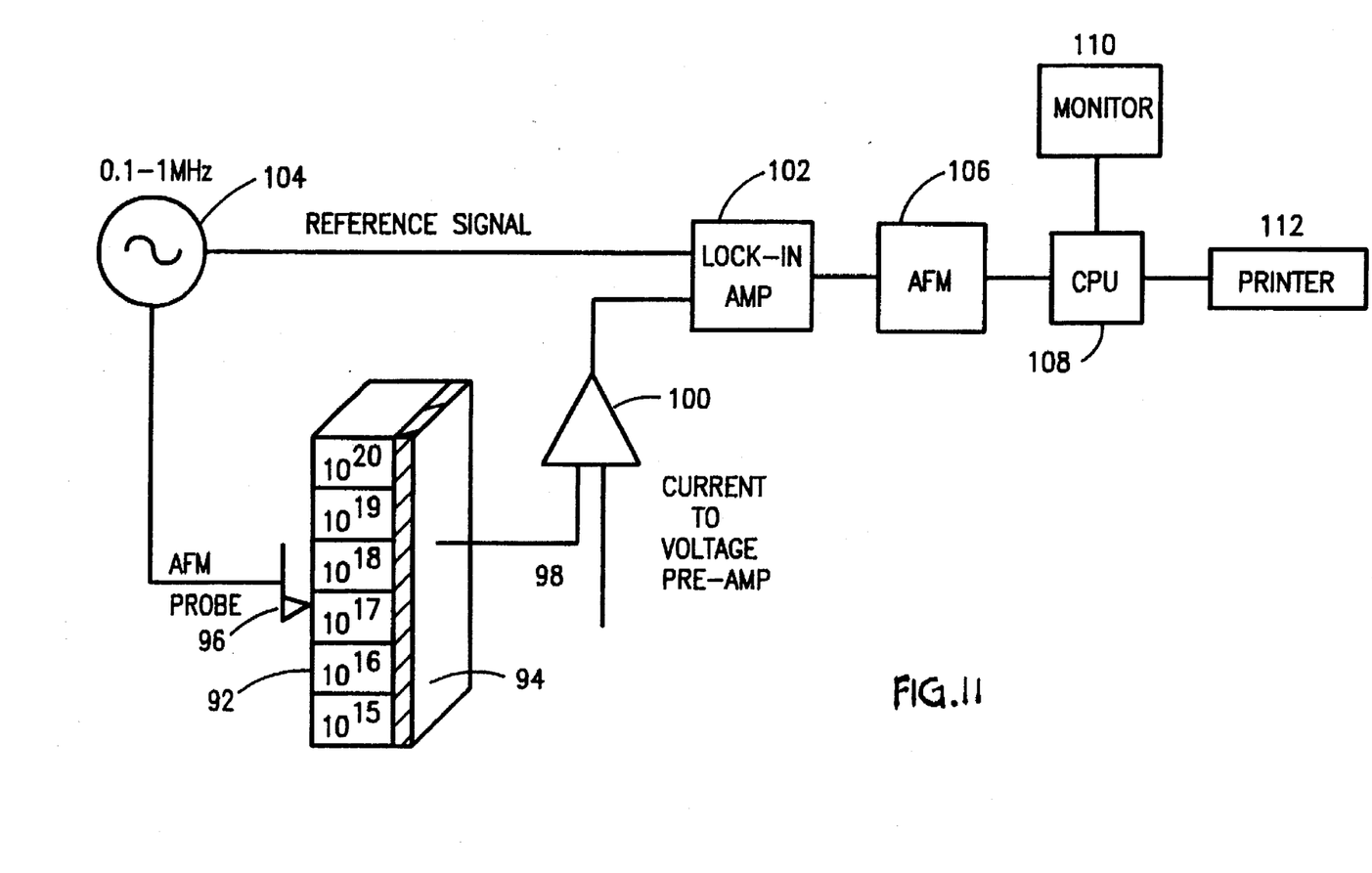
FIG. 11 shows a typical setup to make the measurements of the present invention.

Referring now to FIG. 11, there is shown a typical setup that could be used to take the measurements as described above. Shown is a layer 92 of semiconductor material of different dopant concentrations with a conductive plate 94 connected to one face of the layer 92. The probe 96 is an AFM (atomic force microscopy) probe. Lead 98 connected to conductive plate 94 is connected to opamp 100 which is in turn connected to lock-in amp 102 which compares the signal to a reference signal generated by source 104 which is also input to AFM probe 96. The signal generated by lock-in amplifier 102 is input to AFM 106 for processing and the result is input to CPU 108 from which the results can be viewed via monitor 110 or printed on printer 112.

It is noted that in any of the embodiments shown above it is possible to include one or more regions with a previously determined activated dopant concentration in each of the sections. This known dopant concentration level would be used to calibrate the measurements so that an absolute value would be obtained from each scan.

The foregoing description of the preferred embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A method of measuring the two-dimensional doping profile in a semiconductor, wherein said semiconductor comprises a structure with a vertical dimension and a horizontal dimension, wherein said method comprises the steps of:

providing a section of a semiconductor to be measured by preparing a horizontal section from said semiconductor by cutting said semiconductor through said area to be measured, providing a first surface;

cutting a trench opposite to said area to be measured;

filling said trench with a conductive material;

attaching a conductive plate to a first side of said horizontal section;

scanning a second side of said horizontal section with a probe; and measuring an electrical parameter along a path of a dopant iso-concentration.

2. The method of claim 1, further comprising the steps of:

attaching an electrode to said conductive material in said trench; and scanning said first surface with a probe.

3. The method of claim 2, wherein the step of cutting a trench includes cutting the trench at least the same dimensions as the area to be measured.

4. The method of claim 2, wherein the step of cutting a trench includes making the area to be measured include at least one boundary separating an area with a doping concentration of a first type and an area with a doping concentration of a second type.

5. The method of claim 2, wherein the step of cutting a trench includes making the area to be measured include a boundary separating an area with a first doping concentration of a first type and an area selected from the group consisting of an area with a second doping concentration of a second type and an area with a second doping concentration of the first type.

6. The method of claim 2, wherein said step of cutting a trench includes making the area to be measured include multiple boundaries separating multiple areas of different doping concentrations and types.

7. The method of claim 6, further comprising a step of including at least one area of a known doping concentration whereby said step of measuring an electrical parameter is calibrated to provide an absolute concentration value.

* * * * *